United States Patent
Bossen

(10) Patent No.: US 10,070,127 B2
(45) Date of Patent: Sep. 4, 2018

(54) METHOD AND APPARATUS FOR ARITHMETIC CODING AND TERMINATION

(75) Inventor: Frank Jan Bossen, Mountain View, CA (US)

(73) Assignee: NTT DOCOMO, INC., Tokyo (JP)

( * ) Notice: Subject to any disclaimer, the term of this patent is extended or adjusted under 35 U.S.C. 154(b) by 463 days.

(21) Appl. No.: 13/989,338

(22) PCT Filed: Jan. 13, 2012

(86) PCT No.: PCT/US2012/021240
§ 371 (c)(1),
(2), (4) Date: May 23, 2013

(87) PCT Pub. No.: WO2012/097250
PCT Pub. Date: Jul. 19, 2012

(65) Prior Publication Data
US 2013/0243102 A1    Sep. 19, 2013

Related U.S. Application Data

(60) Provisional application No. 61/433,051, filed on Jan. 14, 2011.

(51) Int. Cl.
*H04N 19/90*   (2014.01)
*H03M 7/40*    (2006.01)
*H03M 7/30*    (2006.01)

(52) U.S. Cl.
CPC .... *H04N 19/00945* (2013.01); *H03M 7/4006* (2013.01); *H03M 7/6005* (2013.01); *H04N 19/90* (2014.11)

(58) Field of Classification Search
CPC ....... H04W 84/12; H04W 64/00; H04W 4/04; H04W 72/042; H04W 12/06;
(Continued)

(56) References Cited

U.S. PATENT DOCUMENTS 5,512,896 A   4/1996  Read et al.
6,173,394 B1  1/2001  Guttag et al.
(Continued)

OTHER PUBLICATIONS

International Preliminary Report on Patentability for International Application No. PCT/US2012/021240, dated Jul. 16, 2013, 5 pages.
(Continued)

*Primary Examiner* — Dave Czekaj
*Assistant Examiner* — Kehinde O Abimbola
(74) *Attorney, Agent, or Firm* — Brinks Gilson & Lione

(57) ABSTRACT

The present invention provides arithmetic encoder and decoder, and methods implemented therein for termination of arithmetic coding. The arithmetic encoder first determines whether a bin value indicates termination of arithmetic encoding. If the bin value is determined not indicating termination of arithmetic encoding, no bit is written in a bitstream indicative of the bin value so determined. If the bin value is determined indicating termination of arithmetic encoding, a stop bit is written in the bitstream. The arithmetic decoder determines whether or not the end of a coded slice has been reached, based on a number of bits in the bitstream. More specifically, the arithmetic decoder makes a determination, based on a number of bits preceding a stop bit located in a last byte in the bitstream.

16 Claims, 10 Drawing Sheets

(58) Field of Classification Search
CPC ............ H04W 4/021; H04W 72/0406; H04W 72/082; H04W 88/06; H04W 24/02; G05B 11/28; G05B 19/40; H04N 21/26283; H04N 21/4532; H04N 21/454; H04N 21/466; H04N 7/163; H04N 21/4334; H04N 21/4668; H04N 21/4751; H04N 21/4755; H04N 21/482; H04N 21/6587

See application file for complete search history.

(56) References Cited

U.S. PATENT DOCUMENTS

| | | | |
|---|---|---|---|
| 6,825,782 B2* | 11/2004 | Bossen | 341/107 |
| 7,688,895 B2* | 3/2010 | Winger | H04N 19/15 375/240.23 |
| 7,948,408 B2* | 5/2011 | Xu | H03M 7/4006 341/107 |
| 8,306,125 B2* | 11/2012 | Kao | H04N 19/436 341/107 |
| 8,542,727 B2* | 9/2013 | Jahanghir | H03M 7/4006 375/232 |
| 2004/0056787 A1* | 3/2004 | Bossen | 341/106 |
| 2004/0059770 A1* | 3/2004 | Bossen | 708/530 |
| 2005/0018774 A1* | 1/2005 | Winger | H04N 19/15 375/240.23 |
| 2005/0052295 A1* | 3/2005 | Bossen | 341/107 |
| 2006/0017591 A1* | 1/2006 | Bossen | 341/50 |
| 2007/0285286 A1 | 12/2007 | Hussain et al. | |
| 2008/0048893 A1* | 2/2008 | Xu | H03M 7/4006 341/60 |
| 2009/0168868 A1* | 7/2009 | Jahanghir | H03M 7/4006 375/240.02 |
| 2009/0196355 A1* | 8/2009 | Kao | H04N 19/91 375/240.25 |
| 2009/0224950 A1* | 9/2009 | Xu | H03M 7/4006 341/51 |
| 2010/0135416 A1* | 6/2010 | Huang | H04N 19/00951 375/240.24 |
| 2011/0080947 A1* | 4/2011 | Chen et al. | 375/240.12 |
| 2011/0292999 A1* | 12/2011 | Jeong | H04N 19/00024 375/240.12 |
| 2012/0106652 A1* | 5/2012 | Huang | H04N 19/70 375/240.25 |
| 2013/0044810 A1* | 2/2013 | Kao | H04N 19/436 375/240.03 |
| 2013/0243102 A1* | 9/2013 | Bossen | 375/240.25 |
| 2014/0169445 A1* | 6/2014 | Jahanghir | H03M 7/4006 375/240.01 |

OTHER PUBLICATIONS

International Search Report and Written Opinion of the International Searching Authority for International Application No. PCT/US2012/021240, dated May 1, 2012, 5 pages.

* cited by examiner

METHOD AND APPARATUS FOR ARITHMETIC CODING AND TERMINATION

RELATED APPLICATIONS

This patent application is a 371 application of PCT/US2012/021240 having an international filing date of Jan. 13, 2012, which claims the benefit of the filing date under 35 U.S.C. § 119(e) of Provisional U.S. Patent Application Ser. No. 61/433,051, filed Jan. 14, 2011, the entire contents of which are incorporated herein by reference.

BACKGROUND

1. Technical Field Text

The present invention relates to arithmetic coding and in particular to method and apparatus for termination of arithmetic coding.

2. Background Information

Arithmetic coding has been successfully applied to compression of media data such as images, and audio. The newest video coding standard H.264/AVC proposed by the ITU-T and MPEG, which is incorporated herein by reference, achieves a significant performance improvement over previous coding standards such as H.263 and MPEG 2. H.264/AVC standard supports two different entropy coding methods, i.e., Context-based Adaptive Variable Length Coding (CAVLC) and Context-based Adaptive Binary Arithmetic Coding (CABAC). Compared with CAVLC, CABAC provides higher coding efficiency at average bit rate saving of 9%-14%. See Li Liu and Xinhua Zhuang "CABAC Based Bit Estimation for First H.264 Rd Optimization Decision," IEEE, 2009, which is incorporated herein by reference.

The basic idea of the CABAC encoding process is recursive interval division. The CABAC engine keeps two registers. The first register is a range register with 9-bits. The second register is an offset register which is 9-bits in a regular mode and 10-bits in a bypass mode. The range register keeps track of the width of the current interval. The offset is from the bit-stream and points to the current location within the range. When decoding a bin, the range is divided into two subintervals depending on the probability of occurrence unique to the bin. After the bin is decoded, the range and offset are updated. After decoding one bin, range and offset will be renormalized to keep the precision to decode a next bin. It ensures the most significant bit of the 9 bit register range is always 1.

Termination of arithmetic encoding typically occurs when the arithmetic encoder reaches the end of a slice. Since the number of macroblocks in a slice is variable, for implementation of CABAC, H.264/AVC requires encoding of a terminating syntax element, called "end_of_slice_flag", for each macro block in a slice to signal the end of a coded slice to the decoder. If a given macroblock is not the last macroblock in the slice, the flag is set to zero and signaled to the decoder, whereas a given macroblock is the last macroblock in the slice, the flag is set to one and signaled to the decoder. The flag is encoded using a specifically designated non-adaptive probability model such that the event of a non-terminating macroblock is related to the highest possible MPS probability. The end_of_slice_flag enables the decoder to determine whether the last macroblock in a coded slice has been decoded.

FIG. 1 shows a flowchart illustrating the CABAC encoding procedure before termination specified in the H.264/AVC standard. See FIG. 9-11 of H.264/AVC. In FIG. 1, the value of codIRange is decremented by 2 at Step 101. It is then determined at Step 102 whether the bin value (binVal) being encoded is not equal to zero. If the bin value is equal to zero, or if the bin includes an event of the terminating syntax element equal to zero, which means that the encoder has not reached the end of a slice, a renormalization procedure is performed at Step 103, and the terminating syntax element (=0) is encoded. If the bin value being encoded is not equal to zero, or if the bin includes an event of the terminating syntax element equal to one, which means that the encoder has reached the end of a slice, CABAC encoding is terminated, and the value of codIlow is set to a sum of the values of codIlow and codIRange at Step 104. The process then advances to Step 105, where an encoder flushing procedure is performed, and the terminating syntax element (=1) is encoded. An exemplary encoder flushing procedure is specified in FIG. 9-12 of H.264/AVC. Lastly, BinCountsInNALunits is incremented by 1 at Step 106.

FIG. 2 shows a flowchart illustrating the CABAC decoding process before termination specified in H.264/AVC. See FIG. 9-6 of H.264/AVC. In FIG. 2, the value of codIRange is decremented by 2 at Step 201. It is then determined at Step 202 whether the value of codIOffeset is greater than or equal to the value of codIRange. If not, the bin value is set to zero at Step 203, which means that the decoder has not reached the end of a coded slice. The process then advances to Step 204 to perform a renormalization procedure. If the value of codIOffeset is greater than or equal to the value of codIRange, which means that the decoder has reached the end of the coded slice, the bin value is set to one at Step 205, and the CABAC decoding process is terminated.

Please note that the encoding process shown in FIG. 1 is performed for each macroblock in a slice. Since repeated for the respective macroblocks in a slice, encoding of the terminating syntax element necessarily results in an increase of the bits in a bitstream, which is not desirable. Although the cost to pay for increased bits resulting from encoding the terminating syntax element may be considered not so large, it increases as the granularity of slices increases. For example, slices may be defined at an increased granularity, such as with 8×8 macroblocks, instead of traditional 16×16 macroblocks. An increase in the granularity is beneficial in that slices can be defined with the number of bits closer to a target number of bits. However, if the granularity is increased to 8×8 from 16×16, the overhand in bits increased by encoding the terminating syntax element becomes quadruple.

SUMMARY OF THE INVENTION

In view of the above issue suffered by the conventional arithmetic coder, the present invention dispenses with encoding the terminating syntax element for the respective macroblocks in a slice in order to avoid an increase of bits resulting from encoding the terminating syntax element.

The present invention provides an arithmetic encoder and a method implemented therein. The encoder first determines whether a bin value indicates termination of arithmetic encoding. If the bin value is determined not indicating termination of arithmetic encoding, no bit is written in a bitstream regarding the bin value so determined. If the bin value is determined indicating termination of arithmetic encoding, a stop bit is written in the bitstream.

If the bin value is determined indicating termination of arithmetic encoding, the encoder sets an offset value to a sum of the offset value and a range value decremented by a predetermined number. The predetermined number may be a number other than two and smaller than or equal to a smallest interval assignable to a least probability symbol. The predetermined number may be equal to a power of 2.

The present invention also provides an arithmetic decoder and a method implemented therein. Since the present invention dispenses with encoding a terminating syntax for each macroblock in a slice, the decoder detects the end of a code slice by comparing the number of bits in the coded slice and the number of bits ingested by the decoder. The number of bits in the coded slice is derived from the number of bits contained in a bitstream received from the encoder. Specifically, the number of bits in the coded slice is the number of bits preceding a stop bit contained in the last byte in the bitstream.

If the decoder determines that the decoding process has not reached the end of the coded slice, the decoder sets a bin value to a first value indicative of the decoding process so determined. On the other hand, if the decoder determines the decoding process has reached the end of the coded slice, the decoder further determines whether an offset value is greater than or equal to a range value decremented by a predetermined number. If the offset value is determined greater than or equal to the range value decremented by the predetermined number, the decoder sets the bin value to a second value indicating that the decoding process has reached the end of the coded slice. If the offset value is determined otherwise, the decoder sets the bin value to the first value.

The predetermined number used in the decoder may be a number other than two and smaller than or equal to a smallest interval assignable to a least probability symbol. The predetermined number may be equal to a power of 2.

DETAILED DESCRIPTION OF THE DRAWINGS AND THE PRESENTLY PREFERRED EMBODIMENTS

Figure 1:
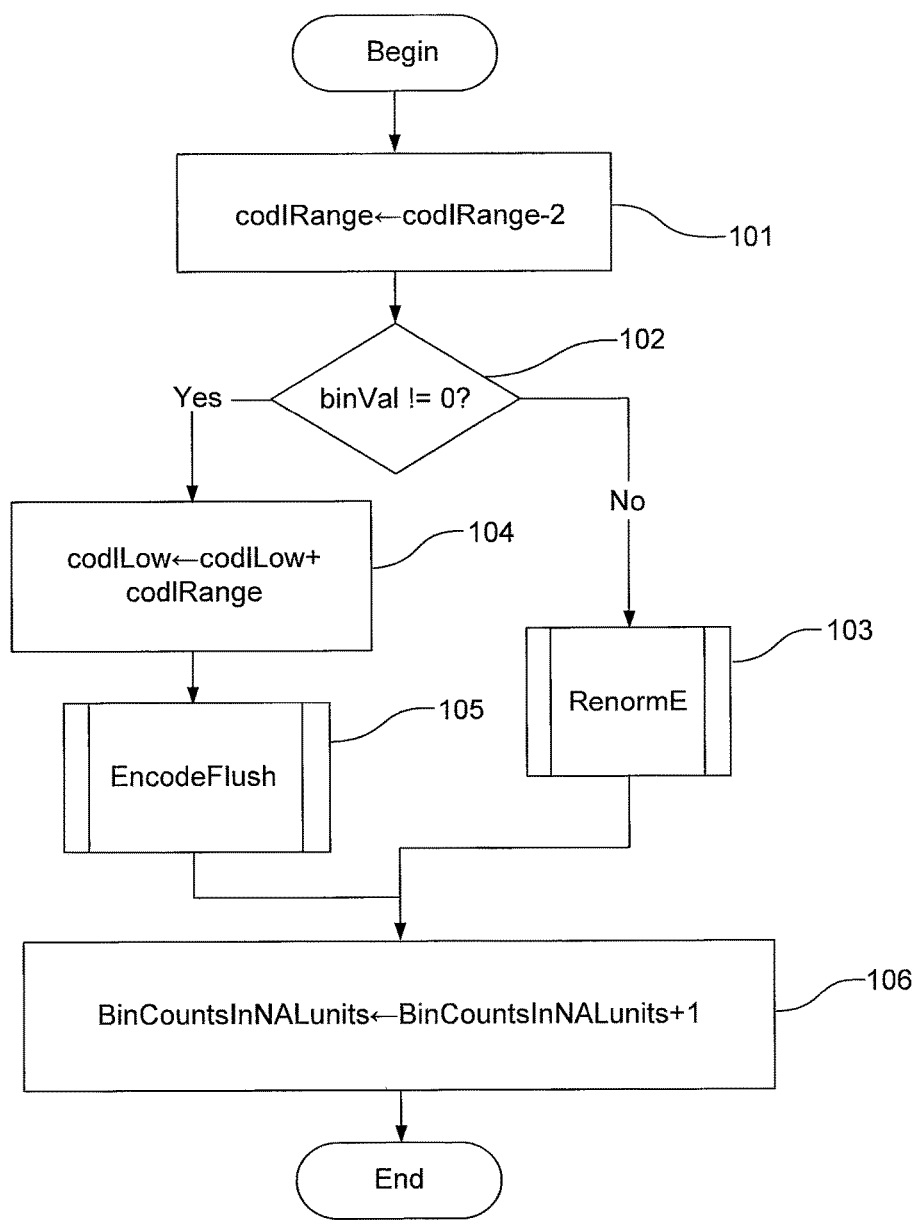
FIG. 1 is a flowchart showing a conventional encoding procedure before termination.
Figure 2:
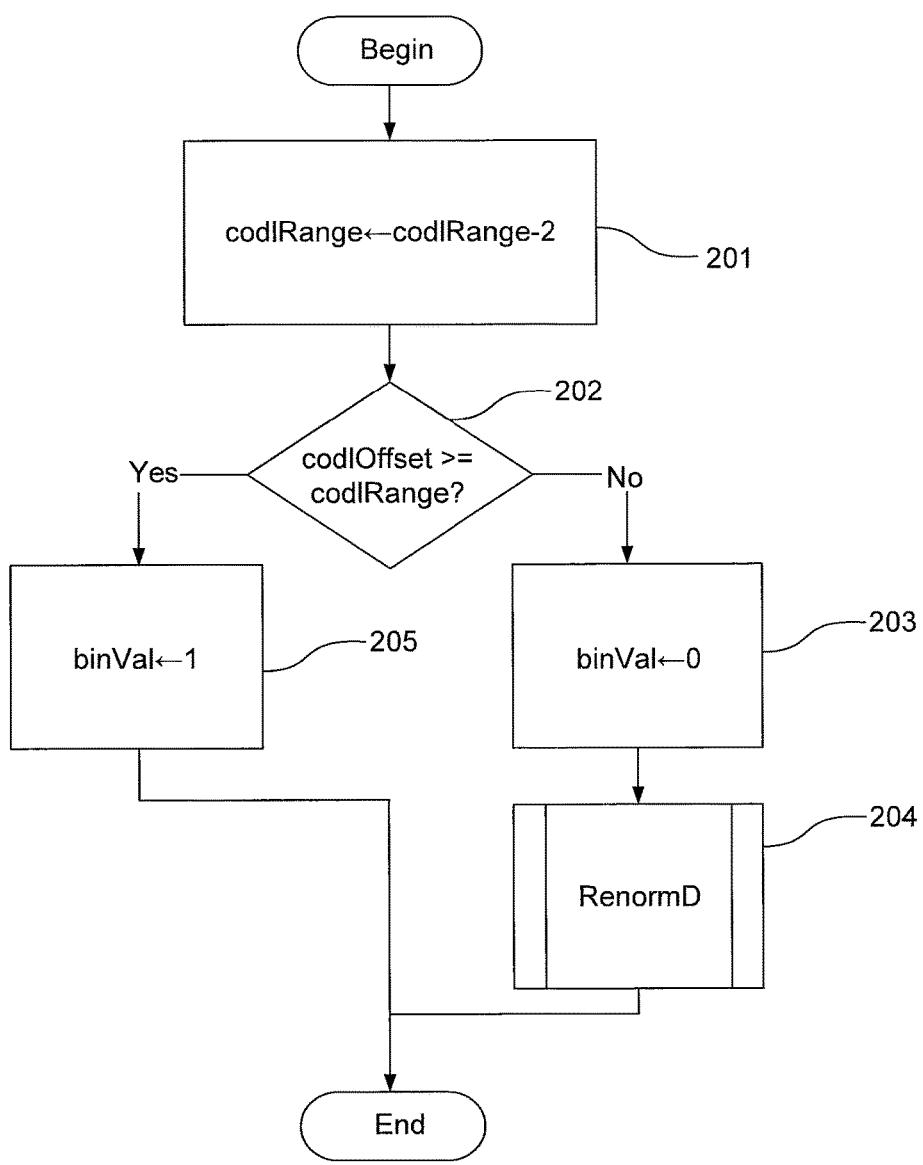
FIG. 2 is a flowchart showing a conventional decoding procedure before termination.
Figure 3:
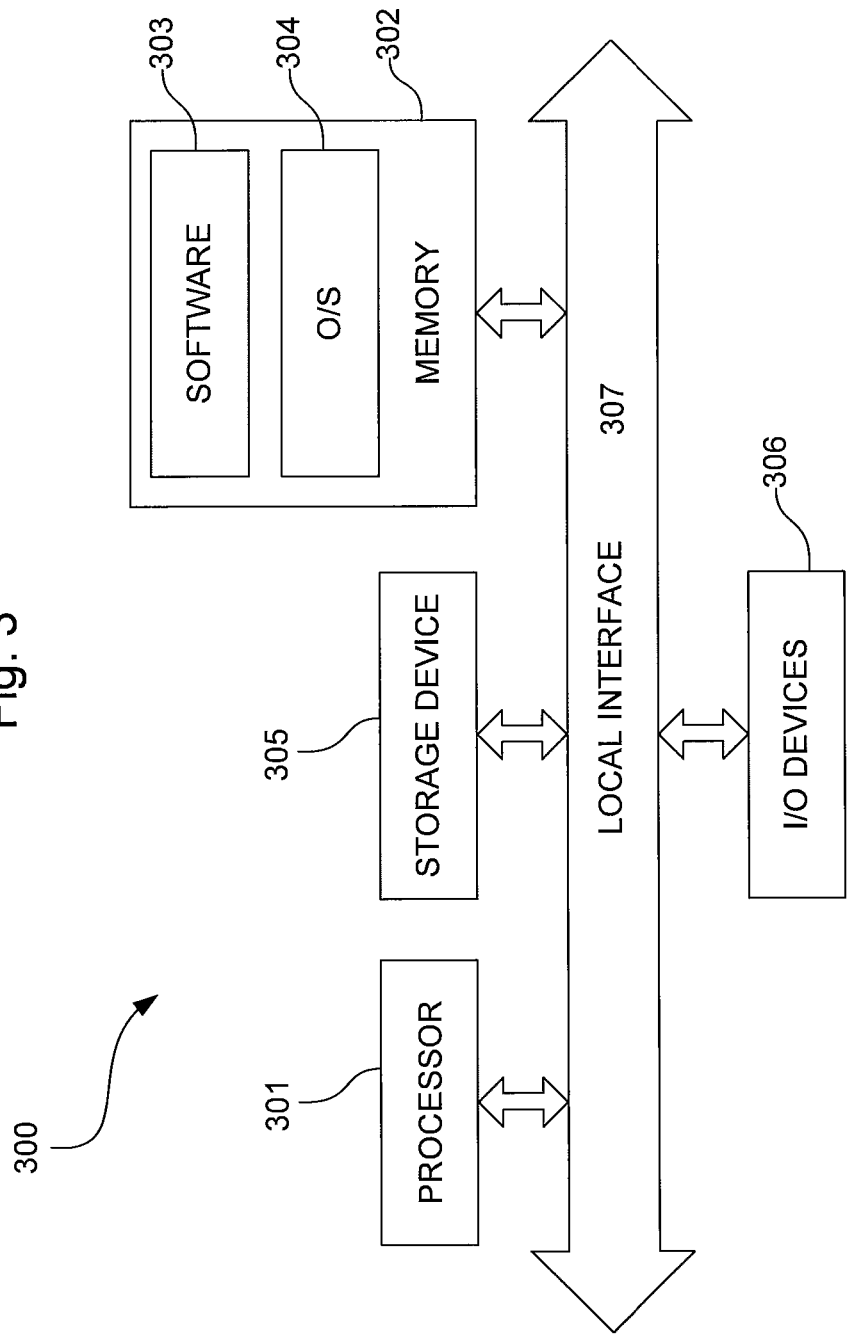
FIG. 3 is a block diagram showing an exemplary hardware architecture on which the present invention could be implemented.

FIG. 3 shows an exemplary hardware architecture of a computer 300 on which the present invention can be implemented. Please note that the hardware architecture shown in FIG. 3 may be common in both a video encoder and a video decoder which implement the embodiments of the present invention. The computer 300 includes a processor 301, memory 302, storage device 305, and one or more input and/or output (I/O) devices 306 (or peripherals) that are communicatively coupled via a local interface 307. The local interface 305 can be, for example, but not limited to, one or more buses or other wired or wireless connections, as is known in the art.

The processor 301 is a hardware device for executing software, particularly that stored in the memory 302. The processor 301 can be any custom made or commercially available processor, a central processing unit (CPU), an auxiliary processor among several processors associated with the computer 300, a semiconductor based microprocessor (in the form of a microchip or chip set), or generally any device for executing software instructions.

The memory 302 comprises a computer readable medium which can include any one or combination of volatile memory elements (e.g., random access memory (RAM, such as DRAM, SRAM, SDRAM, etc.)) and nonvolatile memory elements (e.g., ROM, hard drive, tape, CDROM, etc.). Moreover, the memory 302 may incorporate electronic, magnetic, optical, and/or other types of storage media. A computer readable medium can be any means that can store, communicate, propagate, or transport the program for use by or in connection with the instruction execution system, apparatus, or device. Note that the memory 302 can have a distributed architecture, where various components are situated remote from one another, but can be accessed by the processor 301.

The software 303 in the memory 302 may include one or more separate programs, each of which contains an ordered listing of executable instructions for implementing logical functions of the computer 300, as described below. In the example of FIG. 3, the software 303 in the memory 302 defines the computer 300 video encoding or video decoding functionality in accordance with the present invention. In addition, although not required, it is possible for the memory 302 to contain an operating system (O/S) 304. The operating system 304 essentially controls the execution of computer programs and provides scheduling, input-output control, file and data management, memory management, and communication control and related services.

The storage device 305 of the computer 300 may be one of many different types of storage device, including a stationary storage device or portable storage device. As an example, the storage device 305 may be a magnetic tape, disk, flash memory, volatile memory, or a different storage device. In addition, the storage device 305 may be a secure digital memory card or any other removable storage device 305.

The I/O devices 306 may include input devices, for example, but not limited to, a touch screen, a keyboard, mouse, scanner, microphone, or other input device. Furthermore, the I/O devices 306 may also include output devices, for example, but not limited to, a display, or other output devices. The I/O devices 306 may further include devices that communicate via both inputs and outputs, for instance, but not limited to, a modulator/demodulator (modem; for accessing another device, system, or network), a radio frequency (RF), wireless, or other transceiver, a telephonic interface, a bridge, a router, or other devices that function both as an input and an output.

As is well known by those having ordinary skill in the art, video compression is achieved by removing redundant information in a video sequence. Many different video coding standards exist, examples of which include MPEG-1, MPEG-2, MPEG-4, H.261, H.263, and H.264/AVC. It should be noted that the present invention is not intended to be limited in application of any specific video coding standard. However, the following description of the present invention is provided, using the example of the H.264/AVC standard, as it is the newest video coding standard. In H.264/AVC, each frame or picture of a video can be broken into several slices. The slices are then divided into blocks of 16×16 pixels called macroblocks, which can then be further divided into blocks of 8×16, 16×8, 8×8, 4×8, 8×4, down to 4×4 pixels.

Figure 4:
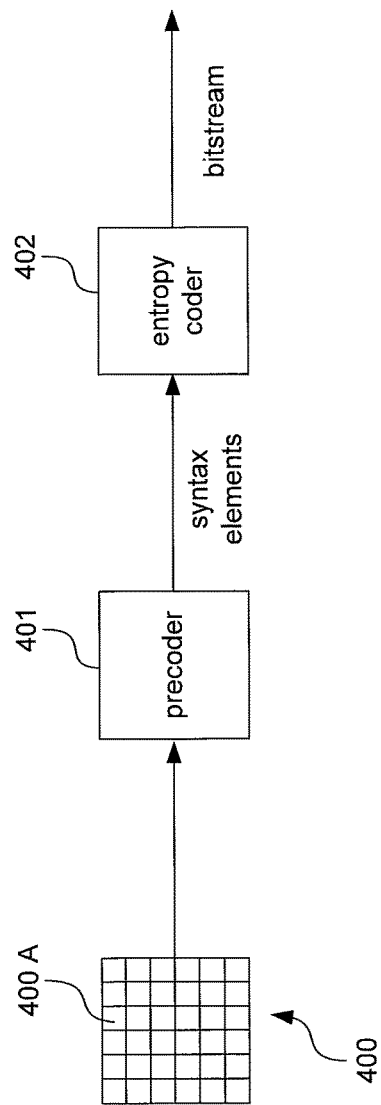
FIG. 4 is block diagram showing an overview of a video encoder to which the present invention could be applied.

FIG. 4 shows an overview of a video encoder to which the present invention could be applied. The blocks shown in the figure represent functional modules realized by the processor 301 executing the software 303 in the memory 302. A picture of video frame 400 is fed to a video pre-coder 401. The video pre-coder treats the picture 400 in units of macroblocks 400A. Each macroblock contains several picture samples of picture 400. On each macroblock a transformation into transformation coefficients is performed followed by a quantization into transform coefficient levels. Moreover, intra-frame prediction or motion compensation is used in order not to perform the coding steps directly on the pixel data but on the differences of same to predicted pixel values, thereby achieving small values which are more easily compressed.

For each slice, the pre-coder 401 generates a number of syntax elements, which form a coded version of the macroblocks of the respective slice. All residual data elements in the syntax elements, which are related to the coding of transform coefficients, such as the transform coefficient levels or a significance map indicating transform coefficient levels skipped, are called residual data syntax elements. Besides these residual data syntax elements, the syntax elements generated by the pre-coder 401 contain control information syntax elements containing control information as to how each macroblock has been encoded and has to be decoded, respectively. In other words, the syntax elements are dividable into two categories. The first category, the control information syntax elements, contains the elements related to a macroblock type, sub-macroblock type, and information on prediction modes both of a spatial and of temporal types as well as slice-based and macroblock-based control information, for example. In the second category, all residual data elements such as a significance map indicating the locations of all significant coefficients inside a block of quantized transform coefficients, and the values of the significant coefficients, which are indicated in units of levels corresponding to the quantization steps, are combined and become residual data syntax elements.

The pre-coder 401 outputs the syntax elements to an entropy coder 402, which is a CABAC encoder and explained in more detail below. The entropy coder 402 generates arithmetic codewords or a bitstream for each slice. When generating the bitstream for a slice, the entropy coder 402 exploits statistical dependencies among the data values of syntax elements in the video signal. The entropy coder 402 outputs the bitstream for each slice of picture 400 to an entropy decoder shown in FIG. 5.

Figure 5:
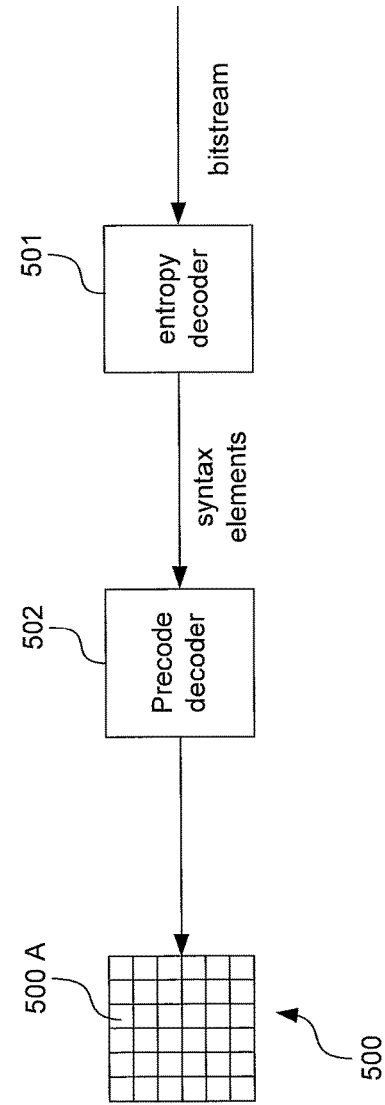
FIG. 5 is a block diagram showing an overview of a video decoder to which the present invention could be applied.

FIG. 5 shows an overview of a video decoder to which the present invention could be applied. Likewise, the blocks shown in the figure represent functional modules realized by the processor 301 executing the software 303 in the memory 302. The entropy decoder 501, which is a CABAC decoder and discussed in more detail below, receives the bitstream and decodes it back into the syntax elements. A pre-code decoder 502 uses the syntax elements in order to retrieve, macroblock by macroblock and then slice after slice, the picture samples of pixels in the picture 500.

Figure 6:
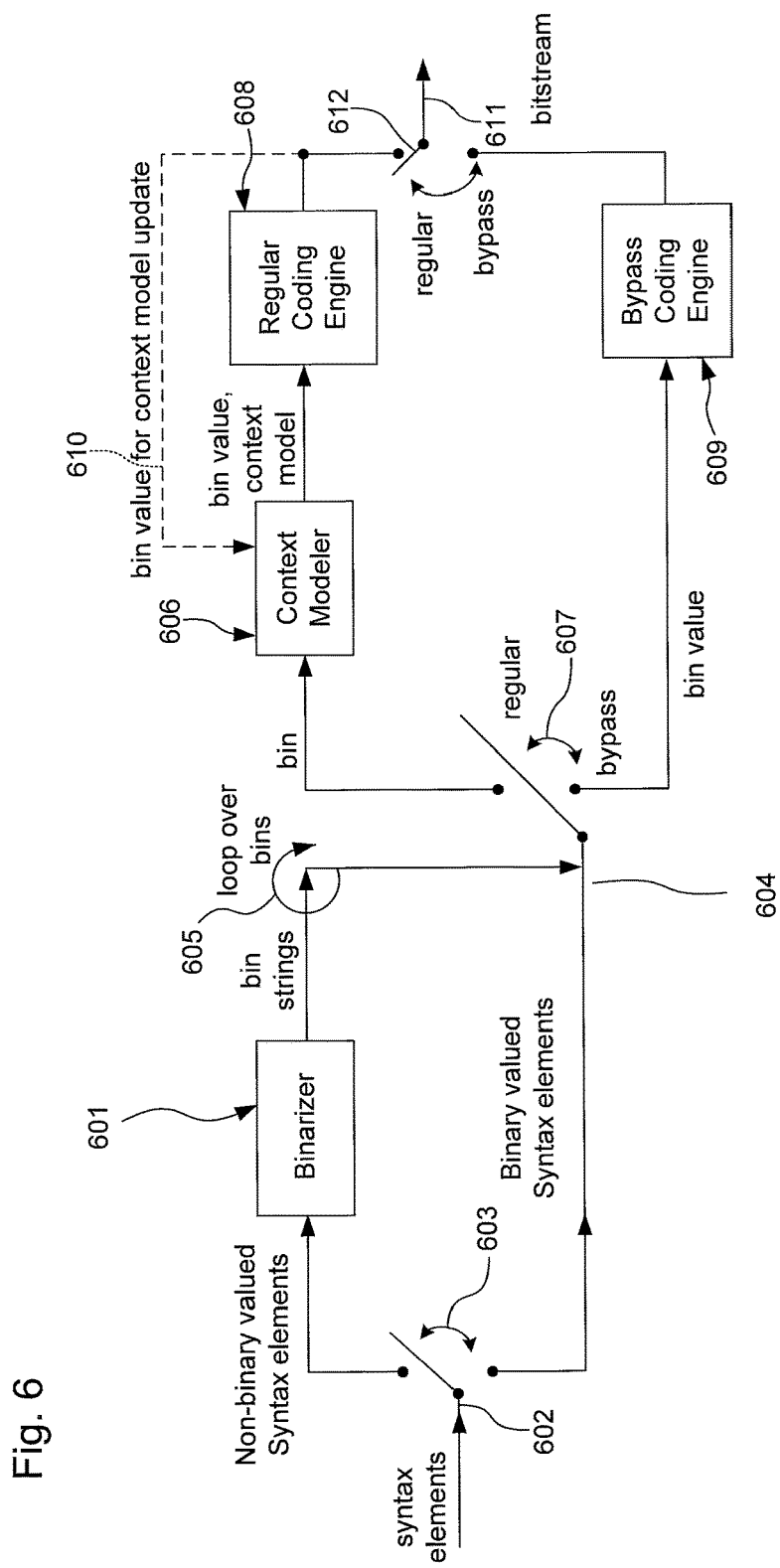
FIG. 6 is a block diagram showing the functional modules of the entropy coder according to an embodiment of the present invention.

FIG. 6 shows the functional modules of the entropy coder 402 for encoding syntax elements into a bitstream. These functional modules are realized by the processor 301 executing the software 303 in the memory 302. The CABAC encoding process comprises three stages of processing, i.e., binarization, context modeling and binary arithmetic coding. To effect the first stage of processing, the entropy coder 402 comprises a binarizer 601. An input of the binarizer 601 is connected to an input 602 via a switch 603. The input 602 provides syntax elements to be encoded by the entropy coder 402. The switch 603 is able to pass syntax elements arriving at the input 602 to either the binarizer 601 or a binarization output 604, thereby bypassing the binarizer 601. The switch 603 functions to pass non-binary valued syntax element to the binarizer 601. Examples for syntax elements that are not in a binarized form are motion vector differences and transform coefficient levels. The switch 603 also functions to directly pass a syntax element from the input 602 to the binarization output 604 if the syntax element is already in a binarized form.

Bin strings outputted by the binarizer 601 may not be passed directly to the binarization output 604, but controllably passed to the output 604 by a bin loop over means 605 arranged between the output of binarizer 601 and the output 604 in order to merge bin strings outputted by the binarizer 601 and already binary valued syntax elements, bypassing the binarizer 601 to a single bit stream at the output 604.

To effect the second stage of processing, the entropy coder 602 comprises a context modeler 606 as well as a switch 607. An input of the context modeler 606 is connected to the binarization output 604 via the switch 607. An output of the context modeler 606 is connected to a regular coding engine 608. The switch 607 functions to pass the bits or bins of a bin sequence to either the context modeler 606 or to a bypass coding engine 609, thereby bypassing the context modeler 606.

For each bin that arrives, the context modeler 606 selects a context model, which approximates a probability distribution modeling statistical dependencies among the values of bins in a bin string, and which is used by the regular coding engine 608 to estimate the probability of occurrence of the respective bin in the bin string. When having assigned a context model to an incoming bin, the context modeler 606 passes the bin over to the regular coding engine 608 together with the context model, to which the bin is assigned. The regular coding engine 608 effects the third stage of processing and arithmetically encodes the value of the bin passed from the context modeler 606 by use of the context model, also passed from the context modeler 606. Further, the regular coding engine 608 passes bin values for context model updates to the context modeler 606 over the feedback line 610.

The bypass coding engine 609 is for arithmetically encoding bin strings by use of a static, predetermined probability estimate. Some of the bins in the bin string outputted by the binarizer 601 show nearly an equi-probable distribution. This means that the bits corresponding to bins in a bin string have a 50/50 chance to be 1 or 0. These bins are fed to the bypass coding engine 609 and are arithmetically encoded by use of the equi-probable probability estimate, which is constant and thus eliminates the computational overheads associated with selection of a context model and updating of probability estimate.

The bitstream outputted from the regular coding engine 608 and the bypass coding engine 609 are merged to a single bitstream at an output 611 by a switch 612. The bitstream represents binary arithmetic codewords of the syntax elements as inputted in the input terminal 602. The regular coding engine 608 and the bypass coding 609 cooperate in order to perform arithmetical coding based on either an adaptive or a static probability estimation.

Figure 7:
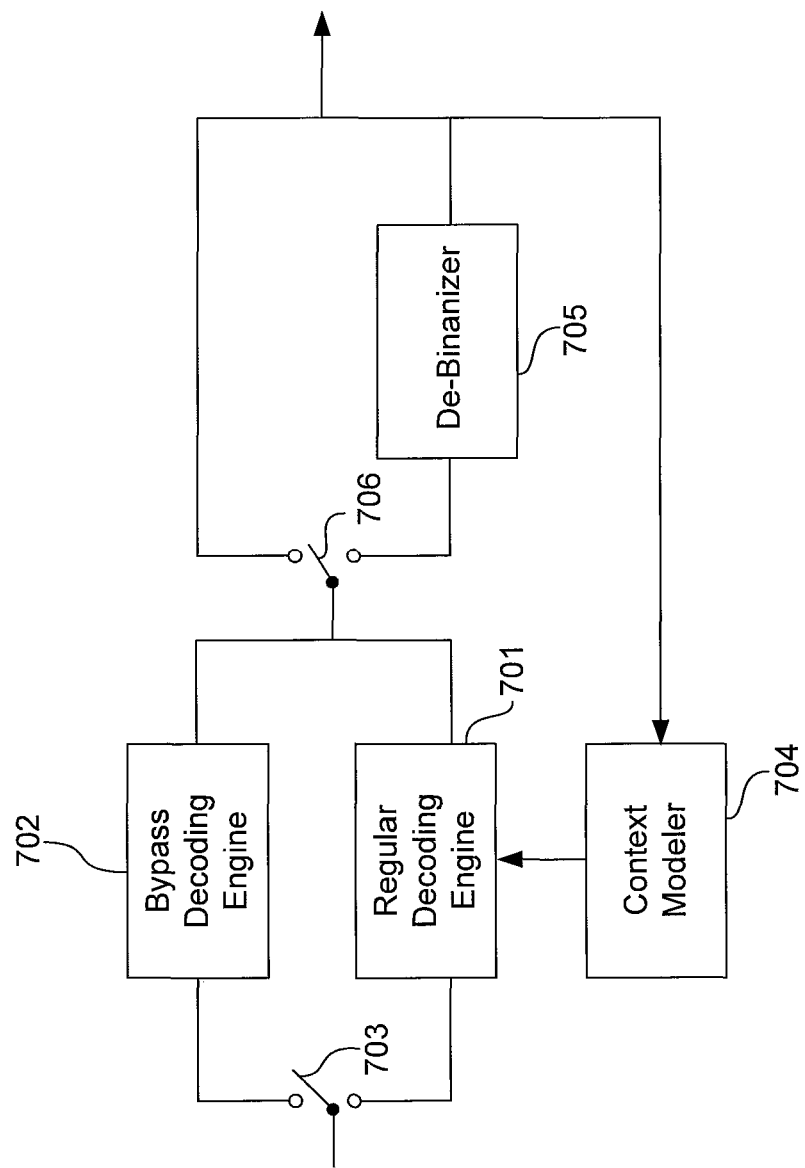
FIG. 7 is a block diagram showing the functional modules of the entropy decoder according to another embodiment of the present invention.

FIG. 7 shows the functional modules of the entropy decoder 501 for decoding a bitstream received from the encoder back into syntax elements. These functional modules are realized by the processor 301 executing the software 303 in the memory 302. In FIG. 7, a bitstream is received by either a regular decoding engine 701 or a bypass decoding engine 702 by the operation of a switch 703. The switch 703 functions to selectively pass a bitstream outputted by the regular coding engine 608 to the regular decoding engine 701 and a bitstream outputted by the bypass coding engine 609 to the bypass decoding engine 702. The regular decoding engine 701 decodes the received bitstream into decoded bins, using adaptive probability estimation according to context models provided by a context modeler 704. The bypass decoding engine 702 decodes the received bitstream into decoded bins, using the equi-probable static probability estimate. The decoded bins either advance to a de-binarizer 705 for de-binarization or bypass the de-binarizer 705 by the operation of a switch 706. The de-binarizer 705 de-binarizes the decoded bins into syntax elements. The syntax elements are fed back to the context modeler 704 for updating of a context model to be provided to the regular decoding engine 701. Each time decoding an arithmetic codeword, the regular decoding engine 701 updates the probability estimates, based on previously decoded at least one bin.

Turning now to detailed operations of the entropy coder 402 and the entropy decoder 501, the attached flowcharts show software processes performed by the entropy coder 402 and the entropy decoder 501 for CABAC encoding and decoding. It should be understood that the encoding and decoding processes described in the attached flowcharts are performed collectively by the functional modules of the entropy coder 402 and the entropy decoder 501 shown in FIGS. 6 and 7, which are realized by the processor 301 executing the software 303 in the memory 302. Please also note that the arithmetic encoding and decoding procedures of the present invention not specifically discussed herein follow the procedures specified in Sections 9.3.3 and 9.3.4 and their respective subsections of H.264/AVC, which is incorporated herein by reference.

Figure 8:
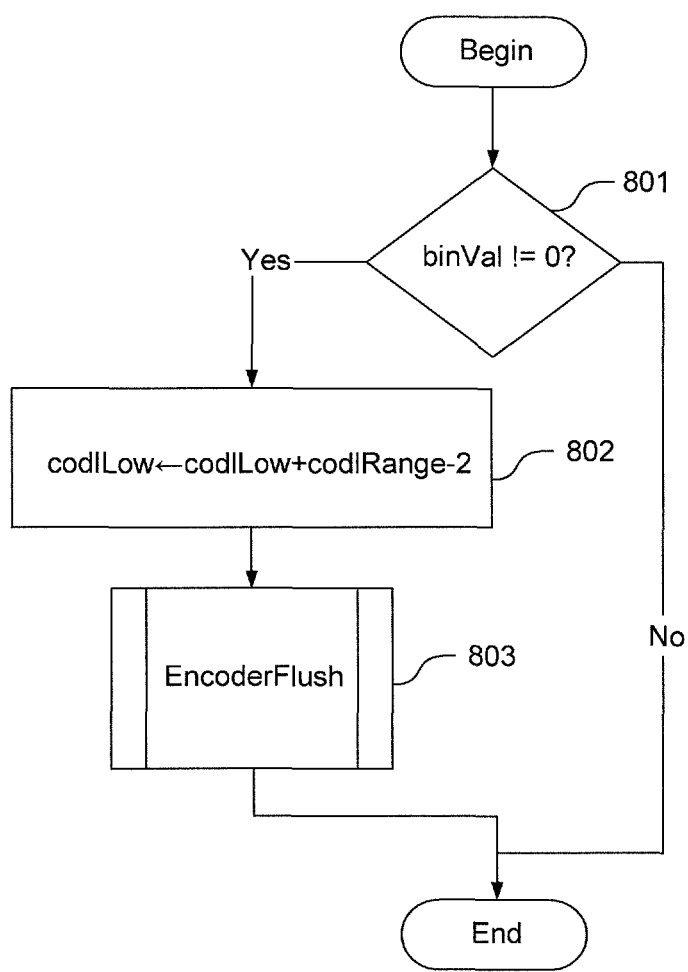
FIG. 8 is a flowchart showing an exemplary encoding procedure before termination according to an embodiment of the present invention.

FIG. 8 is a flowchart showing an exemplary encoding procedure before termination according to an embodiment of the present invention. In the flowchart, it is determined at Step 801 whether the bin value (binVal) is not equal to zero. If the bin value is equal to zero, no operation is performed and therefore, no bits are written in a bitstream. The bin value equal to zero means that the encoder has not reached the end of a slice. If the bin value is not equal to zero, CABAC encoding is terminated, and the process advances to Step 802, where the value of codILow is set to a sum of the value of codILow and the value of codIRange decremented by 2. A flushing procedure is thereafter applied at Step 803.

Figure 9:
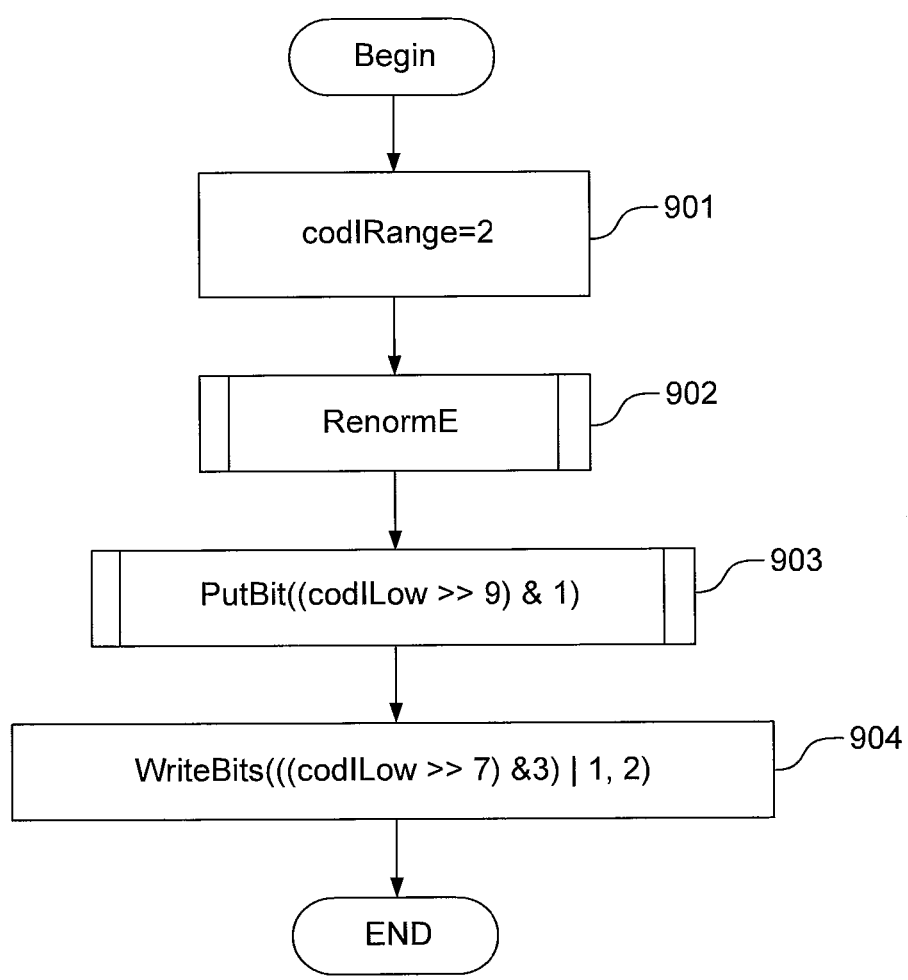
FIG. 9 is a flowchart showing an exemplary flushing procedure performed in Step 803 of FIG. 8.

FIG. 9 is a flowchart showing an exemplary flushing procedure performed at Step 803 in FIG. 8. At Step 901 in FIG. 9, the value of codIRange is set to 2. The process then advances to Step 902, where a renormalization procedure is performed. An exemplary renormalization procedure is specified in FIG. 9-8 of H.264/AVC and discussed in the associated sections. The process thereafter advances to Step 903, where a put bit procedure is performed on a value equal to the value of codILow shifted by nine bit positions to the right and ANDed with the value of 1 Hex. The results of performing the AND operation on the shifted value of codILow cause the bit at the $10_{th}$ bit position as counted from the recent significant bit to be generated and subsequently outputted. An exemplary put bit procedure is specified in FIG. 9-9 of H.264/AVC and discussed in the associated sections. Lastly, the process advances to Step 903 to write two bits in a bitstream which are equal to the value of codILow shifted by seven bit positions to the right, ANDed with a value of 3 Hex, and then ORed with 1 Hex. The OR operation with 1 Hex is performed to write a stop bit in the bitstream.

Thus, in the present invention, no bits indicative of the termination syntax element are written in a bitstream until the encoder has reached the end of a slice, at which time a stop bit is written in the bitstream. Therefore, according to the present invention, a CABAC encoder generates and transmits a bitstream which contains less bits than those generated and transmitted by the conventional CABAC encoder. The use of the present invention can avoid an increase of bits in a bitstream even when the granularity of a slice increases by defining the slice with smaller macroblocks.

Turning now to the decoding process according to the present invention, the attached flowcharts show decoding processes performed by the entropy decoder 501, in which a bitstream is decoded back into syntax elements. The decoding process is basically the reverse of the encoding process for undoing the processing performed by the entropy encoder 402. Please note that the decoding process shown in the attached flowcharts are implemented collectively by the functional modules shown in FIG. 7, which are, as explained above, realized by the processor 301 executing the software 303 in the memory 302.

Figure 10:
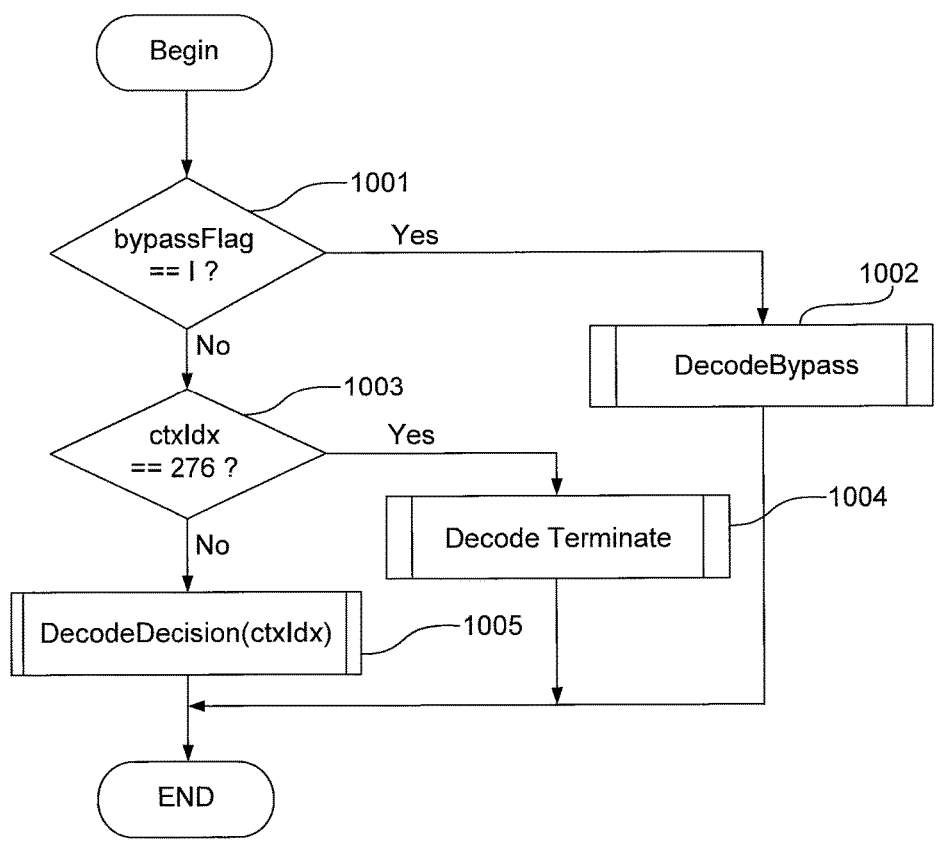
FIG. 10 is a flowchart showing an overview of a decoding procedure according to another embodiment of the present invention.

FIG. 10 is a flowchart showing an overview of decoding procedure for a single bin. In FIG. 10, it is first determined at Step 1001 whether the value of bypassFlag is equal to one. If so, the bypass decoding procedure is performed at Step 1002. An exemplary bypass procedure is specified in FIG. 9-5 of H.264/AVC. If the value of bypassFlag is not equal to one, the process advances to Step 1003, where it is determined whether the value of ctxIdx is equal to 276. The value of ctxIdx equal to 276 is associated with the terminating syntax element. If the value of ctxIdx is equal to 276, the process advances to Step 1004 to perform a decoding procedure before termination, which is discussed below in detail. Otherwise, a decoding procedure for binary decisions is performed at Step 1005. An exemplary decoding procedure for binary decisions is specified in FIG. 9-3 of H.264/AVC.

Figure 11:
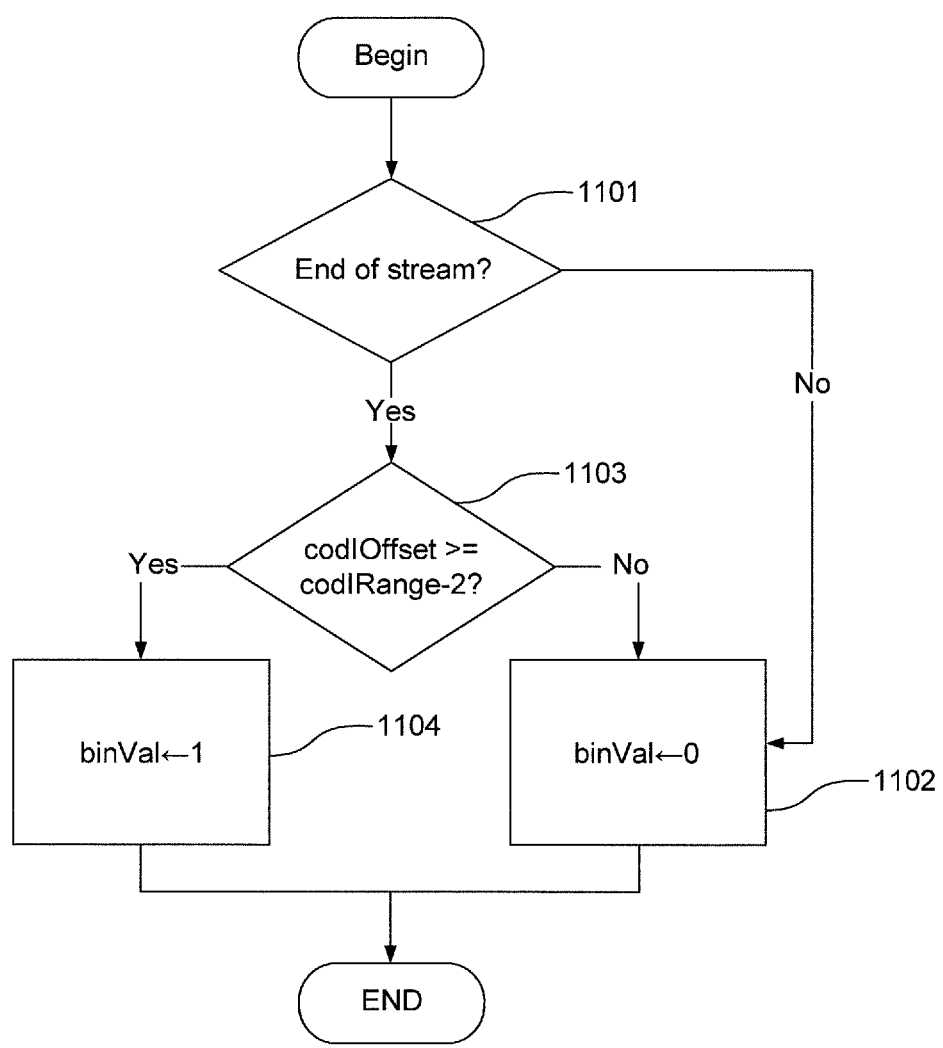
FIG. 11 is a flowchart showing an exemplary decoding procedure before termination according to the embodiment of the present invention.

FIG. 11 is a flowchart showing the decoding procedure before termination, according to the present invention, which is performed at Step 1004 of FIG. 10. Since the encoder of the present invention sends bitstreams which do not contain bits indicative of the terminating syntax element, the decoder of the present invention performs a procedure to detect the end of a coded slice in order to properly reconstruct the original macroblocks. To this effect, it is determined at Step 1101 whether the decoder has reached the end of a coded slice during the decoding procedure. If the decoder has not reached the end of a coded slice, the bin value (binVal) is set to zero at Step 1102. The process thereafter ends. Thus, if the end of a coded slice has not been reached, no further procedure is performed. If the decoder has reached the end of a coded slice, it is further determined at Step 1103 whether the value of codIOffset is greater than or equal to the value of codIRange decremented by two. This determination is necessary because the last bit in a coded slice may contain data describing more than one macroblock. If the value of codIOffset is greater than or equal to the value of codIRange decremented by two, the bin value is set to one at Step 1104. Otherwise, the bin value is set to zero at Step 1102.

The determination process performed at Step 1101 may be implemented in several ways. The number of bits constituting a coded slice can be determined with the size of a bitstream. A syntax element, called NumBytesInNalunit, indicates the number of bytes in a Network Adaptive Layer, which is equal to the size of a bitstream. The last byte in a bitstream contains the stop bit, which indicates the end of a coded slice. Therefore, the number of bits constituting a coded slice is the number of bits preceding the stop bit which may be calculated using the value of NumBytesInNalunit. When a bitstream is transmitted over an IP packet network, the size of a packet is equal to the value of NumBytesInNalunit. Therefore, instead of using the value of NumBytesInNalunit, the size of a packet may be used to determine the number of bits constituting a coded slice. When a bitstream is transmitted in stream video data over a broadcast channel, it is necessary to look for a start code contained in the stream video data. The start code indicates the beginning of a bitstream. By counting the bits transmitted between two adjacent start codes, the number of bits in the bitstream can be determined, which is used to determine the number of bits constituting a coded slice.

Arithmetic decoders have a bit counter to count bits ingested by the decoders. The bit counter increments each time it ingests a bit from a bitstream. The present invention uses the bit counter to determine whether the decoder has reached the end of a coded slice. Specifically, a count of the bit counter is compared with the number of bits calculated above. While a count of the bit counter is smaller than the calculated number of bits, the determination made at Step 1101 in FIG. 11 is "NO", and the process advances from Step 1101 to Step 1102. When a count of the bit counter becomes equal to the calculated number of bits, the process advances to Step 1103 from Step 1101. Please note that in place of the bit counter mentioned above, a bit position counter may be used which outputs information indicative of the position of a bit in the bitstream which is just ingested by the decoder.

Please note that the constant extracted from the value of codIRange at Step 802 in FIG. 8 and Step 1103 in FIG. 11 and set to the value of codIRange at Step 901 in FIG. 9 does not need to be two (2) as long as it is smaller than or equal to the smallest interval that can be assigned to a least probability symbol (LPS). It is preferable that the constant is a power of 2. According to Table 9-44 of H.264/AVC, which shows intervals assignable to a least probability symbol, the smallest interval assignable to a least probability symbol is six (6) when the value of pStateIdx is equal to 62, and the value of qCodIRangeIdx is equal to zero, for example. Therefore, the constant value extracted from the value of codIRange at Step 802 in FIG. 8 and Step 1103 in FIG. 11 and set to the value of codIRange at Step 901 in FIG. 9 may be four (4), instead of two (2). If the value is 4, a bitstream contains one bit less than it does when the value is 2. This has to be taken into consideration when determining the number of bits constituting a coded slice at Step 1201 in FIG. 12.

Whereas many alterations and modifications of the present invention will, no doubt, become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims, which in themselves recite only those features regarded as essential to the invention.

The invention claimed is:

1. An arithmetic encoder comprising a processor of a computer system and a memory that stores programs executable by the processor to:
   binarize a slice of moving picture data, the slice including a plurality of macroblocks each attached with a terminating syntax indicative of whether or not to terminate arithmetic encoding;
   determine whether a bin value representing the terminating syntax included in the binarized slice indicates termination of arithmetic encoding;
   if the bin value is determined not indicating termination of arithmetic encoding, write no bit in a bitstream so that the bin value will not be sent to a decoder; and
   if the bin value is determined indicating termination of arithmetic encoding, write a stop bit in the bitstream.

2. The arithmetic encoder according to claim 1, wherein the processor further sets an offset value to a sum of the offset value and a range value decremented by a predetermined number if the bin value is determined indicating termination of arithmetic encoding, wherein the predetermined number is a number other than two and smaller than or equal to a smallest interval assignable to a least probable symbol.

3. The arithmetic encoder according to claim 2, wherein the predetermined number is equal to a power of 2.

4. An arithmetic encoding method comprising computer executable steps executed by a processor of a video encoder to implement:
   binarize a slice of moving picture data, the slice including a plurality of macroblocks each attached with a terminating syntax indicative of whether or not to terminate arithmetic encoding;
   determining whether a bin value representing the terminating syntax included in the binarized slice indicates termination of arithmetic encoding;
   if the bin value is determined not indicating termination of arithmetic encoding, writing no bit in a bitstream so that the bin value will not be sent to a decoder; and
   if the bin value is determined indicating termination of arithmetic encoding, writing a stop bit in the bitstream.

5. The method according to claim 4, further comprising setting an offset value to a sum of the offset value and a range value decremented by a predetermined number if the bin value is determined indicating termination of arithmetic encoding, wherein the predetermined number is a number other than two and smaller than or equal to a smallest interval assignable to a least probable symbol.

6. The method according to claim 5, wherein the predetermined number is equal to a power of 2.

7. An arithmetic decoder comprising a processor of a computer system and a memory which stores programs executable by the processor to:
   based on a number of bits in a bitstream, determine whether or not an decoding process has reached an end of a coded slice, the coded slice including a plurality of coded macroblocks each stripped off a terminating syntax indicative of whether or not to terminate arithmetic decoding;

if it is determined that the decoding process has not reached the end of the coded slice, set a bin value to a first value of the terminating syntax not indicative of termination of arithmetic decoding; and debinarize the first value so that the stripped off terminating syntax will be reconstructed and attached to a macroblock in a decoded slice.

8. The arithmetic decoder according to claim 7, wherein if it is determined that the decoding process has reached the end of the coded slice, the processor further:

determines whether an offset value is greater than or equal to a range value decremented by a predetermined number;

if the offset value is determined greater than or equal to a range value decremented by a predetermined number, sets the bin value to a second value indicating that the decoding process has reached the end of the coded slice; and if the offset value is determined otherwise, sets the bin value to the first value.

9. The arithmetic decoder according to claim 8, wherein the predetermined number is a number other than two and smaller than or equal to a smallest interval assignable to a least probable symbol.

10. The arithmetic decoder according to claim 9, wherein the predetermined number is equal to a power of 2.

11. The arithmetic decoder according to claim 7, wherein the processor determines whether the decoding process has reached an end of a coded slice, based on a number of bits preceding a stop bit located in a last byte in the bitstream.

12. An arithmetic decoding method comprising computer executable steps executed by a processor of a video decoder to implement:

based on a number of bits in a bitstream, determining whether an decoding process has reached an end of a coded slice, the coded slice including a plurality of coded macroblocks each stripped off a terminating syntax indicative of whether or not to terminate arithmetic decoding;

if it is determined that the decoding process has not reached the end of the coded slice, setting a bin value to a first value of the terminating syntax not indicative of termination of arithmetic decoding; and debinarizing the first value so that the stripped off terminating syntax will be reconstructed and attached to a macroblock in a decoded slice.

13. The method according to claim 12, further comprising:

if it is determined that the decoding process has reached the end of the coded slice, determining whether an offset value is greater than or equal to a range value decremented by a predetermined number;

if the offset value is determined greater than or equal to a range value decremented by a predetermined number, setting the bin value to a second value indicating that the decoding process has reached the end of the coded slice; and if the offset value is determined otherwise, setting the bin value to the first value.

14. The method according to claim 13, wherein the predetermined number is a number other than two and smaller than or equal to a smallest interval assignable to a least probable symbol.

15. The method according to claim 14, wherein the predetermined number is equal to a power of 2.

16. The method according to claim 12, wherein determining whether an decoding process has reached an end of a coded slice comprises determining whether the decoding process has reached an end of a coded slice, based on a number of bits preceding a stop bit located in a last byte in the bitstream.

* * * * *